(12) United States Patent
Bertolini et al.

(10) Patent No.: US 12,191,869 B2
(45) Date of Patent: Jan. 7, 2025

(54) CONTROL CIRCUIT FOR AN ELECTRONIC CONVERTER, RELATED INTEGRATED CIRCUIT, ELECTRONIC CONVERTER AND METHOD

(71) Applicant: STMicroelectronics S.r.l., Agrate Brianza (IT)

(72) Inventors: Alessandro Bertolini, Vermiglio (IT); Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 241 days.

(21) Appl. No.: 17/982,712

(22) Filed: Nov. 8, 2022

(65) Prior Publication Data
US 2023/0163767 A1 May 25, 2023

(30) Foreign Application Priority Data
Nov. 19, 2021 (IT) .................. 102021000029294

(51) Int. Cl.
*H03L 7/099* (2006.01)
*H02M 1/00* (2006.01)
(Continued)

(52) U.S. Cl.
CPC ........ *H03L 7/0991* (2013.01); *H02M 1/0025* (2021.05); *H02M 3/158* (2013.01);
(Continued)

(58) Field of Classification Search
CPC . H03L 7/07; H03L 7/081; H03L 7/091; H03L 7/0991; H03L 7/10; H02M 1/0025; H02M 3/158
(Continued)

(56) References Cited

U.S. PATENT DOCUMENTS

| | | | |
|---|---|---|---|
| 8,717,101 B2* | 5/2014 | Li | H03F 1/0205 330/285 |
| 2021/0226531 A1* | 7/2021 | Bertolini | G05F 1/461 |

OTHER PUBLICATIONS

IT Search Report and Written Opinion for priority application, IT 102021000029294, report dated Jul. 5, 2022, 10 pgs.
(Continued)

*Primary Examiner* — Yemane Mehari
(74) *Attorney, Agent, or Firm* — Crowe & Dunlevy LLC

(57) ABSTRACT

In a control circuit for a switching stage of an electronic converter, a phase detector generates a drive signal in response to a phase difference between first and second clock signals. The first and second clock signals are generated by first and second current-controlled oscillators, respectively. An operational transconductance amplifier generates first and second control currents in response to a difference between a reference and a feedback of the electronic converter, with the first and second currents applied to control the first and second current-controlled oscillators. In response to a switching clock having a first state, a switching circuit applies first and second bias currents to the control inputs of the first and second current-controlled oscillators, respectively. Conversely, in response to the switching clock having a second state, the switching circuit applies the second and first bias currents to the control inputs of the first and second current-controlled oscillators, respectively.

20 Claims, 12 Drawing Sheets

(51) Int. Cl.
*H02M 3/158* (2006.01)
*H03L 7/07* (2006.01)
*H03L 7/081* (2006.01)
*H03L 7/091* (2006.01)
*H03L 7/10* (2006.01)

(52) U.S. Cl.
CPC ................ *H03L 7/07* (2013.01); *H03L 7/081* (2013.01); *H03L 7/091* (2013.01); *H03L 7/10* (2013.01)

(58) Field of Classification Search
USPC ........................................................ 323/283
See application file for complete search history.

(56) References Cited

OTHER PUBLICATIONS

Khan Qadeer et al: "A 10-25MHZ, 600 mA buck converter using time-based PID compensator with 2 a/MHz quiescent current, 94% peak efficiency, and 1MHz", 2014 Symposium On VLSI Circuits Digest of Technical Papers, IEEE, Jun. 10, 2014, pp. 1-2, XP032622444.
Seong Joong Kim et al: "High Frequency Buck Converter Design Using Time-Based Control Techniques", IEEE Journal of Solid-State Circuits, vol. 50, No. 4, Apr. 1, 2015, pp. 990-1001, XP055727308.

\* cited by examiner

CONTROL CIRCUIT FOR AN ELECTRONIC CONVERTER, RELATED INTEGRATED CIRCUIT, ELECTRONIC CONVERTER AND METHOD

PRIORITY CLAIM

This application claims the priority benefit of Italian Application for Patent No. 102021000029294, filed on Nov. 19, 2021, the content of which is hereby incorporated by reference in its entirety to the maximum extent allowable by law.

TECHNICAL FIELD

The embodiments of the present description refer to a control device for a buck voltage converter.

BACKGROUND

Power-supply circuits, such as AC/DC or DC/DC switched mode power supplies, are well known in the art. There exist many types of electronic converters, which are mainly divided into isolated and non-isolated converters. For instance, non-isolated electronic converters are the converters of the "buck", "boost", "buck-boost", "Ćuk", "SEPIC", and "ZETA" type. Instead, isolated converters are, for instance, converters of the "flyback", "forward", "half-bridge", and "full-bridge" type. Such types of converters are well known to the person skilled in the art, as evidenced e.g., by the application note AN513/0393 "Topologies for Switched Mode Power Supplies", L. Wuidart, 1999, STMicroelectronics (incorporated herein by reference).

FIG. 1 is a schematic illustration of a DC/DC electronic converter 20. In particular, a generic electronic converter 20 comprises two input terminals 200a and 200b for receiving a DC voltage $V_{in}$ and two output terminals 202a and 202b for supplying a DC voltage $V_{out}$. For example, the input voltage $V_{in}$ may be supplied by a DC voltage source 10, such as a battery, or may be obtained from an AC voltage by means of a rectifier circuit, such as a bridge rectifier, and possibly a filtering circuit. Instead, the output voltage $V_{out}$ may be used to supply a load 30.

FIG. 2 shows the circuit schematic of a typical buck voltage converter 20. In particular, a buck converter 20 comprises two input terminals 200a and 200b for receiving a DC input voltage $V_{in}$ and two output terminals 202a and 202b for supplying a regulated voltage $V_{out}$, where the output voltage is equal to or lower than the input voltage yin.

In particular, typically, a buck converter 20 comprises two electronic switches Q1 and Q2 (with the current path thereof) connected (e.g., directly) in series between the input terminals 200a and 200b, wherein the intermediate node between the electronic switches Q1 and Q2 represents a switching node Lx. Specifically, the electronic switch Q1 is a high-side switch connected (e.g., directly) between the (positive) terminal 200a and the switching node Lx, and the electronic switch Q2 is a low-side switch connected (e.g., directly) between the switching node Lx and the (negative) terminal 200b, which often represents a ground GND. The (high-side) switch Q1 and the (low-side) switch Q2 hence represent a half-bridge configured to connect the switching node Lx to the terminal 200a (voltage $V_{in}$) or the terminal 200b (ground GND).

For example, the switches Q1 and/or Q2 are often transistors, such as Field-Effect Transistors (FETs), such as Metal-Oxide-Semiconductor Field-Effect Transistors (MOSFETs), e.g., n-channel FETs, such as NMOS transistors. Frequently, the second electronic switch Q2 is also implemented just with a diode, where the anode is connected to the terminal 200b and the cathode is connected to the switching node Lx.

In the example considered, an inductance L, such as an inductor, is connected (e.g., directly) between the switching node Lx and the (positive) output terminal 202a. Instead, the (negative) output terminal 202b is connected (e.g., directly) to the (negative) input terminal 200b.

In the example considered, to stabilize the output voltage $V_{out}$, the converter 20 typically comprises a capacitor Cout connected (e.g., directly) between the output terminals 202a and 202b.

In this context, FIG. 3 shows exemplary waveforms of the signals of such an electronic converter, where: waveform a) shows the signal $DRV_1$ for switching the electronic switch Q1; waveform b) shows the signal $DRV_2$ for switching the second electronic switch Q2; waveform c) shows the current $I_{Q1}$ that traverses the electronic switch Q1; waveform d) shows the voltage $V_{Lx}$ at the switching node Lx (i.e., the voltage at the second switch Q2); and waveform e) shows the current $I_L$ that traverses the inductor L.

In particular, when the electronic switch Q1 is closed at an instant $t_1$ (ON state), the current $I_L$ in the inductor L increases (substantially) linearly. The electronic switch Q2 is at the same time opened. Instead, when the electronic switch Q1 is opened after an interval Tom at an instant $t_2$ (OFF state), the electronic switch Q2 is closed, and the current $I_L$ decreases (substantially) linearly. Finally, the switch Q1 is closed again after an interval $T_{OFF1}$. In the example considered, the switch Q2 (or a similar diode) is hence closed when the switch Q1 is open, and vice versa.

The current $I_L$ can thus be used to charge the capacitor Cout, which supplies the voltage $V_{out}$ at the terminals 202a and 202b.

In the example considered, the electronic converter 20 comprises thus a control circuit 22 configured to drive the switching of the switch Q1, and possibly of the switch Q2, for repeating the intervals $T_{ON1}$ and $T_{OFF1}$ periodically. For example, typically the buck converter 20 comprises also a feedback circuit 24, such as a voltage divider (Div), configured to generate a feedback signal FB indicative of (and preferably proportional to) the output voltage $V_{out}$, and the control circuit 22 is configured to generate the drive signals $DRV_1$ and optionally $DRV_2$ by comparing the feedback signal FB with a reference signal, such as a reference voltage $V_{REF}$.

A significant number of driving schemes are known for generating the drive signal $DRV_1$ and optionally $DRV_2$. These solutions have in common the possibility of regulating the output voltage $V_{out}$ by regulating the duration of the interval Tom and/or the interval $T_{OFF1}$.

For example, in many applications, the control circuit 22 generates a Pulse-Width Modulation (PWM) signal $DRV_1$, wherein the duration of the switching interval $T_{SW}=T_{ON1}+T_{OFF1}$ is constant, but the duty cycle $T_{ON}/T_{SW}$ is variable. For example, a typical control scheme involves that the duration of the interval Tom is varied via a regulator circuit having at least an integral component, such as a PI (Proportional-Integral) or PID (Proportional-Integral-Derivative) regulator.

Specifically, as well known, a buck converter may be operated in a Continuous-Conduction Mode (CCM), Discontinuous-Conduction Mode (DCM) or Transition Mode (TM).

As shown in FIG. 4A, when the control circuit 20 operates the converter in the CCM mode, the current $I_L$ flowing through the inductance L has a value different from zero at the end of the interval $T_{OFF1}$ (see FIG. 3). In this case, the control circuit 20 uses two switching phases $T_1$ and $T_2$, with $T_{SW}=T_1+T_2$, wherein: during the phase $T_1$ ($T_1=T_{ON1}=T_{OFF2}$) the switch Q1 is closed and the switch/diode Q2 is opened; and during the phase $T_2$ ($T_2=T_{OFF1}=T_{ON2}$) the switch Q1 is opened and the switch/diode Q2 is closed.

For example, in CCM, the control circuit 20 may use switching cycles $T_{SW}$ with fixed duration, but the switch-on duration $T_{ON1}=T_1$ may be varied via a PID regulator, i.e., the signal $DRV_1$ is a PWM signal with (fixed or predetermined frequency) but the switch-on duration/duty cycle is determined as a function of the output voltage (and the reference signal $V_{REF}$). Conversely, the optional signal $DRV_2$ may correspond to the inverted version of the signal $DRV_1$.

Conversely, as shown in FIG. 4B, when the control circuit 20 operates the converter in the DCM mode, the current $I_L$ flowing through the inductance L reaches zero during the interval $T_{OFF1}$ and remains at zero until the end of the interval $T_{OFF1}$ (see FIG. 3). In this case, the control circuit 20 uses indeed three switching phases $T_1$, $T_2$ and $T_3$, with $T_{SW}=T_1+T_2+T_3$, wherein: during the phase $T_1$ ($T_1=T_{ON1}$) the switch Q1 is closed and the switch/diode Q2 is opened; during the phase $T_2$ ($T_2=T_{ON2}$) the switch Q1 is opened and the switch/diode Q2 is closed; and during the phase $T_3$ ($T_{OFF1}=T_2+T_3$ and $T_{OFF2}=T_3+T_1$) the switch Q1 is opened and the switch/diode Q2 is opened.

For example, when using a diode as switch Q2, this diode will automatically open when the current $I_L$ reaches zero, thereby ending the interval $T_2$. Conversely, when using a controllable electronic switch Q2, usually the control circuit 20 comprises (or is connected to) a demagnetization detection circuit configured to determine the instant when the current $I_L$ reaches zero (corresponding to the end of the interval $T_2$ and the beginning of the interval $T_3$). For example, such a demagnetization detection circuit may monitor the current $I_L$. For example, in FIG. 2 is shown a current sensor 24b connected in series with the electronic switch Q2, such as a shunt resistor, which thus generates a measurement signal CS indicative of (and preferably proportional to) the current $I_L$ flowing during the interval $T_2$ through the inductance L.

Accordingly, in DCM, the control circuit 20 may again use switching cycles $T_{SW}$ with fixed duration, where the switch-on duration $T_{ON1}=T_1$ may again be varied via a PID regulator, i.e., the signal $DRV_1$ is a PWM signal with fixed or predetermined frequency, and the switch-on duration/duty cycle is determined as a function of the output voltage (and the reference signal $V_{REF}$). However, when using a controllable electronic switch Q2, the control circuit 20 may be configured to open the electronic switch Q2 when the signal CS indicates a demagnetization of the inductance L.

The CCM and the DCM modes of a buck converter have thus in common that often a fixed frequency PWM signal $DRV_1$ may be used to drive the electronic switch Q1. Conversely, an optional drive signal $DRV_2$ may be determined as a function of the drive signal $DRV_1$ and (when operated in DCM) an additional signal CS indicative of the demagnetization of the inductance L.

In general, also (usually fixed) dead times may be introduced between the switching of the drive signals, e.g., between the falling edge of the signal $DRV_1$ and the rising edge of the signal $DRV_2$, and similarly (in CCM mode) between the falling edge of the signal $DRV_2$ and the rising edge of the signal $DRV_1$. Insofar as these intervals are usually short compared to the durations $T_{ON}$ and $T_{OFF}$, these intervals will not be considered in the following. However, also in this case, the drive signal $DRV_2$ may be determined as a function of the drive signal $DRV_1$.

Other electronic converters often using a PWM modulation are for example boost, buck-boost, flyback or forward converters, various types of half-bridge converter, etc.

For example, FIG. 5 shows an example of a boost converter. Specifically, in the example considered, an inductance L, such as an inductor, is connected (e.g., directly) between the positive input terminal 200a and a switching node Lx. The switching node Lx is connected (e.g., directly) via (the current path of) a first electronic switch S1 to the negative input terminal 200b, which in turn is usually connected (e.g., directly) to the negative output terminal 202b. The switching node Lx is also connected (e.g., directly) via (the current path of) a second electronic switch S2 to the positive output terminal 202a. For example, the electronic switches S1 and S2 may be MOSFET. Generally, the electronic switch S2 may also be implemented only with a diode. Usually a capacitance Cout, such as a capacitor, is connected between the output terminals 202a and 202b.

Also in this case the electronic switch S1 may be driven via a PWM signal $DRV_1$, wherein the duty cycle is determined as a function of the output voltage $V_{out}$ and a reference voltage $V_{REF}$. Conversely, when a controllable electronic switch S2 is used, the electronic switch S2 may be driven via a signal $DRV_2$, which: in CCM may correspond to the inverted version of the signal $DRV_1$; or in DCM may be determined as a function of the signal $DRV_1$ and a signal CS indicative of the demagnetization of the inductance L, such as a current measurement signal CS being proportional to the current $I_L$ flowing through the inductance L.

In this respect, FIG. 6 shows a generic electronic converter 20 using a PWM signal DRV with fixed or predetermined frequency. Specifically, the electronic converter 20 comprises a switching stage 26 connected between the input terminals 200a, 200b and the output terminal 202a, and 202b. Such a switching stage 26 comprises one or more electronic switches $SW_{26}$ and at least one inductance $L_{26}$, such as inductors or transformers, and optionally one or more capacitances $C_{26}$, such as capacitors. For example, in a buck converter (FIG. 2), these components are the switch Q1, the switch or diode Q2, the inductance L and the capacitance Cout. Conversely, in a boost converter (FIG. 5), these components are the switch S1, the switch or diode S2, the inductance L and the capacitance Cout.

In the example considered, the control circuit 22 comprises a driver circuit 222 configured to generate one or more drive signals for the switching stage 26 as a function of: the PWM signal DRV, which has switching cycles $T_{SW}$ (with fixed or predetermined period) wherein the signal DRV is set to a first logic level (e.g., high) for a first duration $T_{ON}$ and to a second logic level (e.g., low) for a second duration $T_{OFF}$, with $T_{SW}=T_{ON}+T_{OFF}$ (see also FIG. 7) and an optional measurement signal CS indicative of the demagnetization of the inductance $L_{26}$.

For example, as mentioned before, the PWM signal DRV may be used to drive the switch Q1 of FIG. 2 and the switch S1 of FIG. 5. Conversely, the measurement signal CS may be used when the electronic converter is operated in the DCM mode, e.g., for driving the electronic switch Q2 of FIG. 2 or the switch S2 of FIG. 5.

In line with the description of FIG. 2, usually a feedback circuit 24 is used to generate a feedback signal FB indicative of (and preferably proportional to, e.g., corresponding to)

the output voltage $V_{out}$. Next a regulator circuit 220, such as a PID regulator, may vary the duration $T_{ON}$ of the PWM signal DRV as a function of the feedback signal FB and a reference signal $V_{REF}$.

For example, as described in document U.S. Pat. No. 9,091,741 B2 (incorporated by reference), such PID regulators are often implemented with an error amplifier comprising an operational amplifier and a feedback network comprising one or more capacitors and resistors.

Recently another type of regulator circuit 220 has been used, wherein a time-based regulation is used to generate the PWM signal DRV. Time-based DC-DC converters are gaining popularity, because this type of control scheme offers many advantages. By virtue of the continuous-time digital nature of the time-based regulators, they combine the advantages of conventional analog and digital controller circuit 220. Basically, they operate with (e.g., CMOS-level) digital signals, but without adding any quantization error typically found in digital controllers. Deploying simple circuits such as ring oscillators, delay lines, and flip-flops, time-based regulator circuits 220 eliminate the need for wide bandwidth error amplifiers and PWM blocks in analog regulator circuits, or high-resolution analog-to-digital converters (ADCs) and digital PWM blocks in digital regulator circuits. Using time as the processing variable, this new type of control provides an attractive solution for implementing wide-bandwidth high-switching frequency PWM-based electronic converters, because it obviates the need for power and area demanding wide bandwidth amplifiers and high-speed comparators present in conventional PID controllers.

For example, such a time based PID is described in United States Application for Patent Publication No. 2021/0226531 A1 (incorporated by reference).

There is a need in the art to provide a time-based control device for a PWM driven electronic converter, such as a buck or boost converter.

SUMMARY

According to one or more embodiments, a control circuit for an electronic converter is provided. Embodiments moreover concern a related integrated circuit, electronic converter and method.

Various embodiments of the present disclosure relate to a control circuit for a switching stage of an electronic converter configured to provide via two output terminals an output voltage. For example, the electronic converter may be a buck or boost converter.

In various embodiments, the control circuit, e.g., implemented in an integrated circuit, comprises one or more terminals configured to provide one or more respective drive signals to one or more electronic switches of the switching stage of the electronic converter, and a terminal configured to receive from a feedback circuit a first feedback signal proportional to the output voltage.

In various embodiments, the control circuit comprises a driver circuit configured to generate the one or more drive signals as a function of a Pulse-Width Modulation (PWM) signal, and a PWM signal generator circuit configured to generate the PWM signal as a function of the first feedback signal and a reference voltage.

Specifically, in various embodiments, the PWM signal generator circuit comprises a first current-controlled oscillator having an input terminal for receiving a first current and configured to generate a first clock signal as a function of the first current, and a second current-controlled oscillator having an input terminal for receiving a second current and configured to generate a second clock signal as a function of the second current.

Moreover, in various embodiments, the PWM signal generator circuit comprises a first operational transconductance amplifier and a phase detector. Specifically, the first operational transconductance amplifier has a first output terminal and is configured to provide at the first output terminal a third current indicative of the difference between the reference voltage and the first feedback signal, wherein the first output terminal of the first operational transconductance amplifier is connected to the input terminal of the first current-controlled oscillator. The phase detector has inputs coupled to the first oscillator and the second oscillator and provides at an output the PWM signal.

Specifically, according to various embodiment, the PWM signal generator circuit further comprises a first bias current generator having an output terminal and configured to provide at the output terminal a first bias current, and a second bias current generator having an output terminal and configured to provide at the output terminal a second bias current. Specifically, in various embodiments, a switching circuit is configured to receive a clock signal and determine the logic level of the clock signal. In response to determining that the logic level of the clock signal has a first logic level, the switching circuit connects the output terminal of the first bias current generator to the input terminal of the first current-controlled oscillator and connects the output terminal of the second bias current generator to the input terminal of the second current-controlled oscillator. Conversely, in response to determining that the logic level of the clock signal has a second logic level, the switching circuit connects the output terminal of the first bias current generator to the input terminal of the second current-controlled oscillator and connects the output terminal of the second bias current generator to the input terminal of the first current-controlled oscillator.

For example, in various embodiments, the clock signal is derived from the first clock signal or the second clock signal. For example, the clock signal may correspond to the first clock signal or the second clock signal.

In various embodiments, the PWM signal generator circuit may also comprise one or more first delay lines connected between the first oscillator and the phase detector, and/or one or more second delay lines connected between the second oscillator and the phase detector. For example, these delay lines may be used to implement a Proportional and/or Derivative component of the regulator. For example, in order to implement a Proportional component, the one or more first delay lines and/or the one or more second delay lines may be driven as a function of the difference between the reference voltage and the first feedback signal. Conversely, in order to implement a Derivative component, the control circuit may comprise a third terminal configured to receive from an analog differentiator a second feedback signal proportional to the derivative of the output voltage. In this case the one or more first delay lines and/or the one or more second delay lines may be driven as a function of the difference between the reference voltage and the second feedback signal.

For example, in various embodiments, the one or more first delay lines and the one or more second delay lines are current-controlled delay lines. In this case, the PWM signal generator circuit may comprise a second operational transconductance amplifier configured to generate a fourth current indicative of the difference between the reference voltage and the first feedback signal and/or a third operational transconductance amplifier configured to generate a fifth current indicative of the difference between the reference voltage and the second feedback signal. Accordingly, the fourth current and the fifth current may be provided to the one or more first delay lines and/or the one or more second delay lines.

Generally, also differential operational amplifiers may be used. For example, the first operational transconductance amplifier may be a differential operational transconductance amplifier comprising a second output terminal, wherein the first operational transconductance amplifier is configured to provide at the second output terminal a sixth current, wherein the difference between the sixth current and the third current is proportional to the difference between the reference voltage and the first feedback signal. In this case, the second output terminal of the first operational transconductance amplifier may thus be connected to the input terminal of the second current-controlled oscillator.

Similarly, in order to implement the Proportional component, the second operational transconductance amplifier may indeed generate two currents, wherein a first current is applied to one or more first delay lines and a second current is applied to the one or more second delay lines, wherein the difference between these currents is proportional to the difference between the reference voltage and the first feedback signal. Conversely, in order to implement the Derivative component, the third operational transconductance amplifier may generate two currents, wherein a first current is applied to one or more first delay lines and a second current is applied to the one or more second delay lines, wherein the difference between these currents is proportional to the difference between the reference voltage and the second feedback signal. In various embodiments, the first current generated by the second operational transconductance amplifier and the first current generated by the third operational transconductance amplifier may be summed and applied to the same one or more first delay lines. Similarly, the second current generated by the second operational transconductance amplifier and the second current generated by the third operational transconductance amplifier may be summed and applied to the same one or more second delay lines.

BRIEF DESCRIPTION OF THE DRAWINGS

The embodiments of the present disclosure will now be described with reference to the annexed plates of drawings, which are provided purely to way of non-limiting example and in which.

The features and advantages of the present invention will become apparent from the following detailed description of practical embodiments thereof, shown by way of non-limiting example in the accompanying drawings, in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 8 to 14 described below, parts, elements or components that have already been described with reference to FIGS. 1 to 7 are designated by the same references used previously in these figures. The description of these elements has already been made and will not be repeated in what follows in order not to burden the present detailed description.

As explained in the foregoing, various embodiments of the present disclosure relate to an improved time-based control circuit 22a for an electronic converter. For a general description of electronic converters using a PWM signal reference can be made to the previous description of FIGS. 1 to 7. Conversely, for a general description of time-based PID regulators, reference can be made to the previously cited United States Patent Application Publication No. 2021/0226531 A1 (incorporated by reference).

Figure 1:
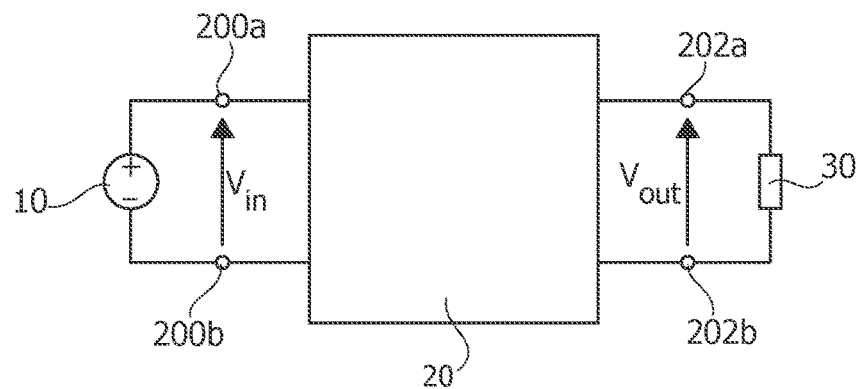
FIG. 1 shows an example of an electronic converter.
Figure 2:
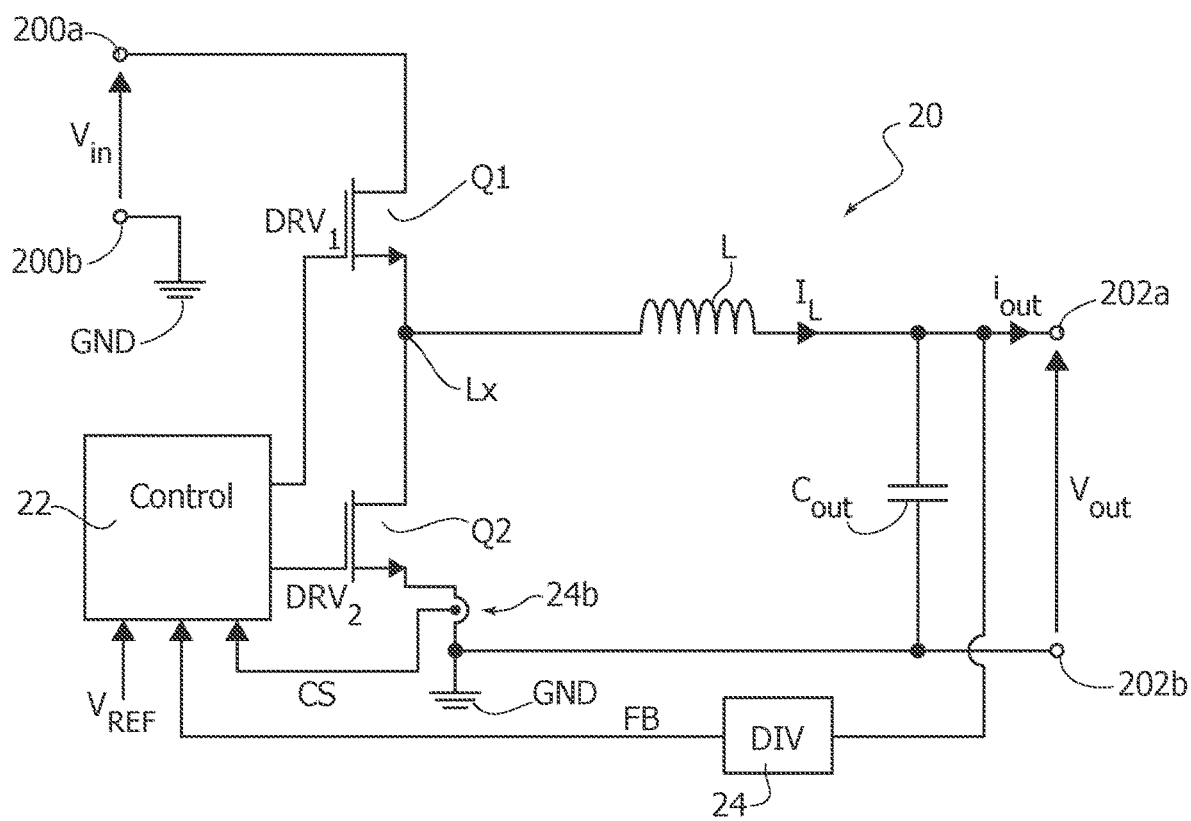
FIG. 2 shows an example of a buck converter.
Figure 3:
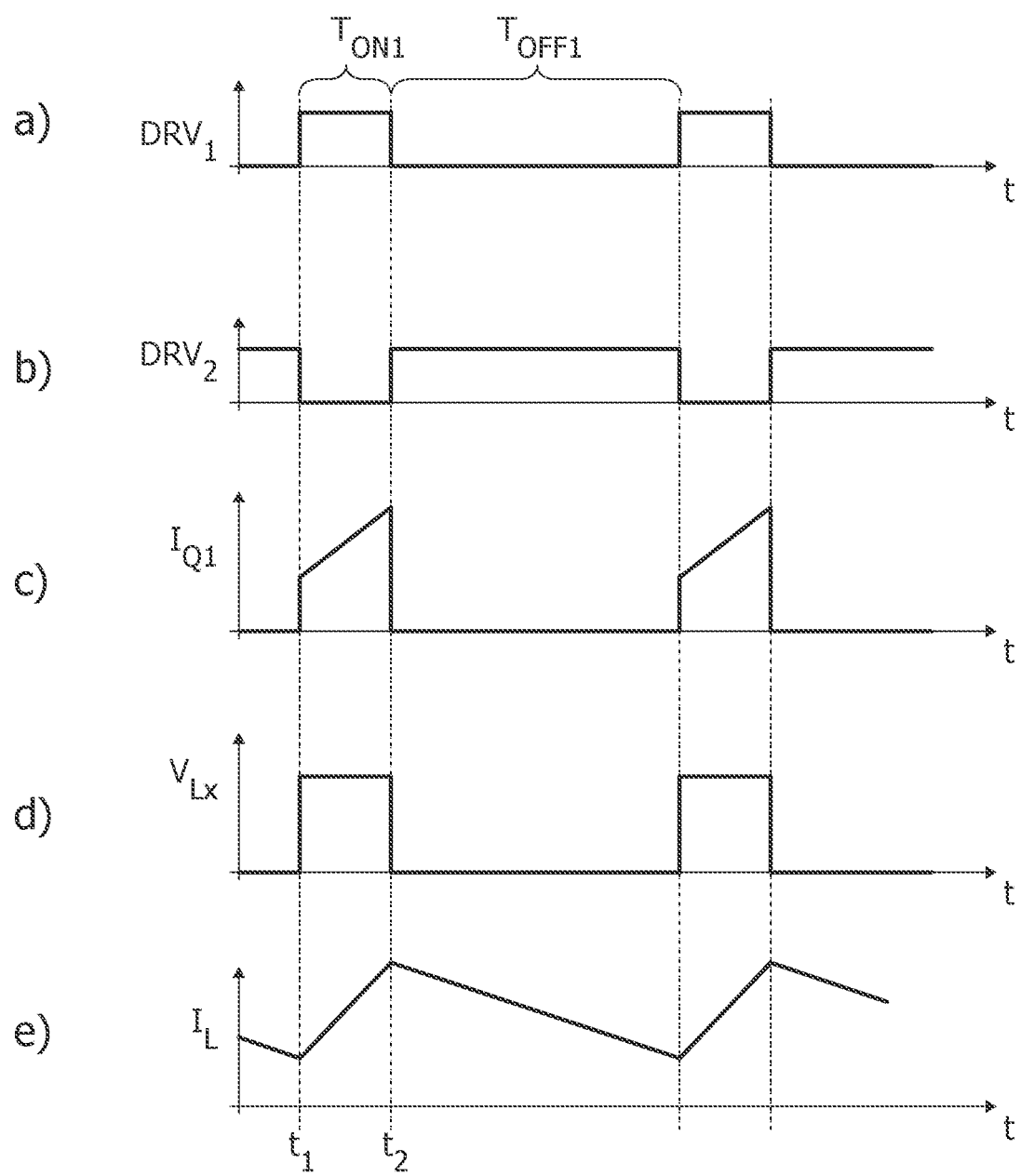
FIG. 3 shows exemplary waveforms of the buck converter of FIG. 2.
Figure 4A:
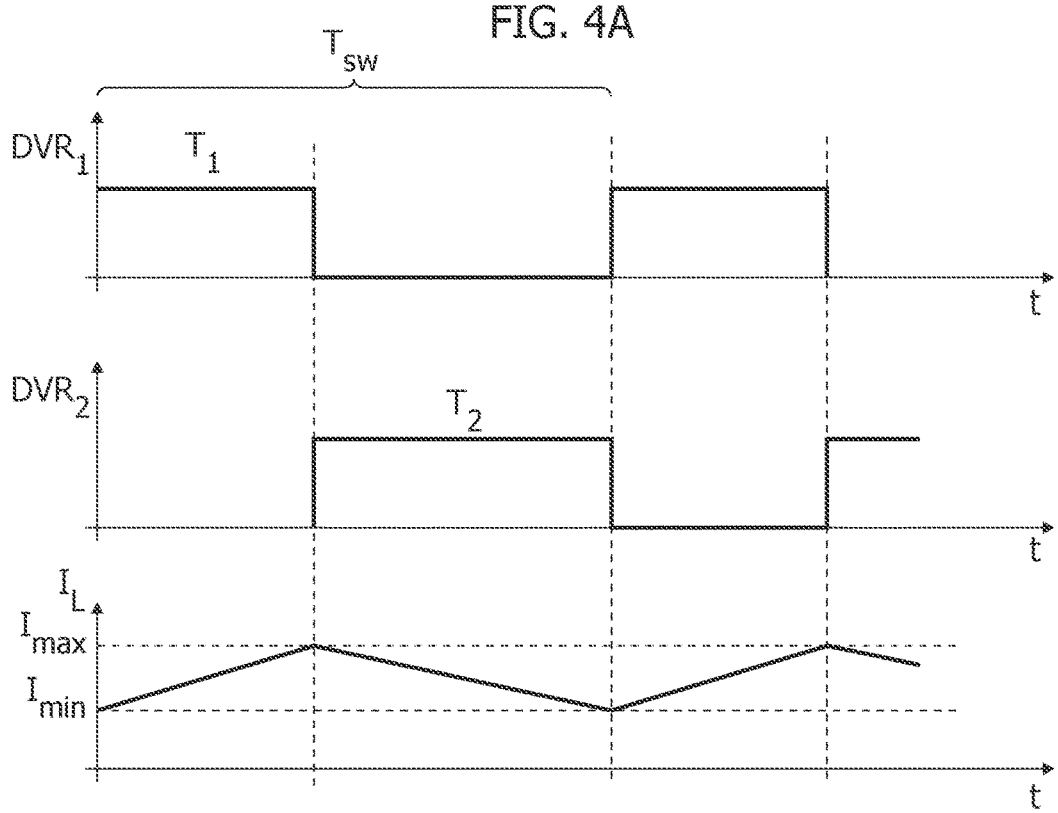
FIG. 4A shows waveforms when the buck converter of FIG. 2 is operated in a CCM mode.
Figure 4B:
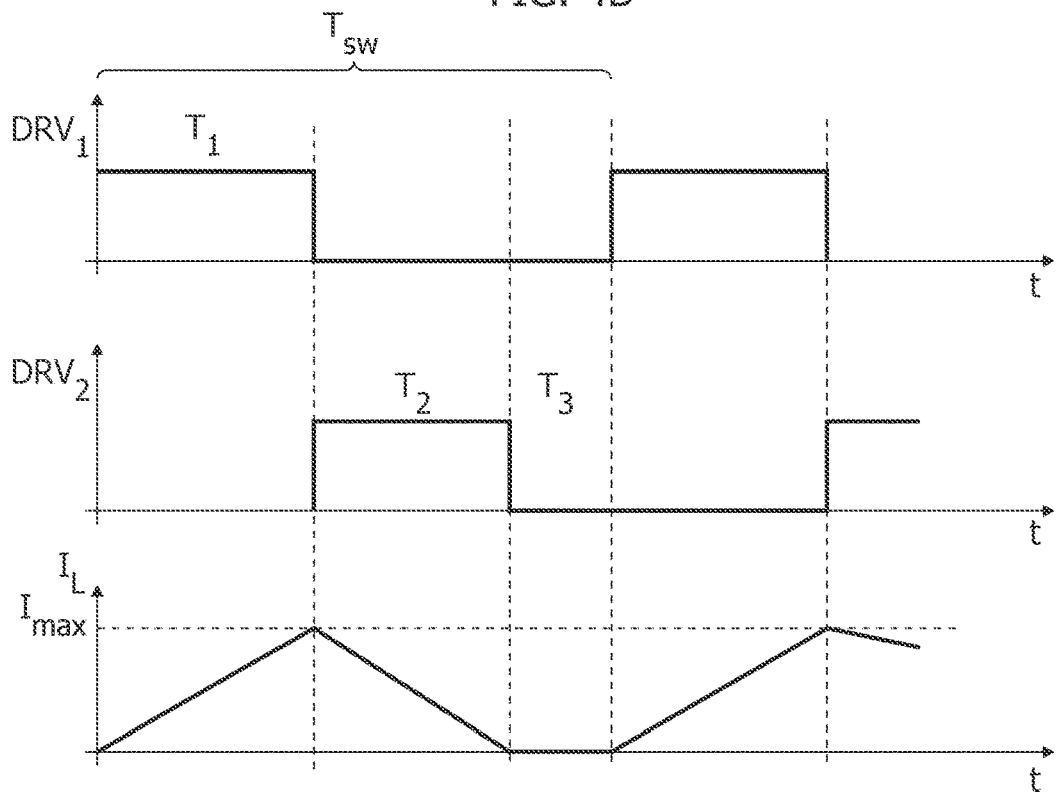
FIG. 4B shows waveforms when the buck converter of FIG. 2 is operated in a DCM mode.
Figure 5:
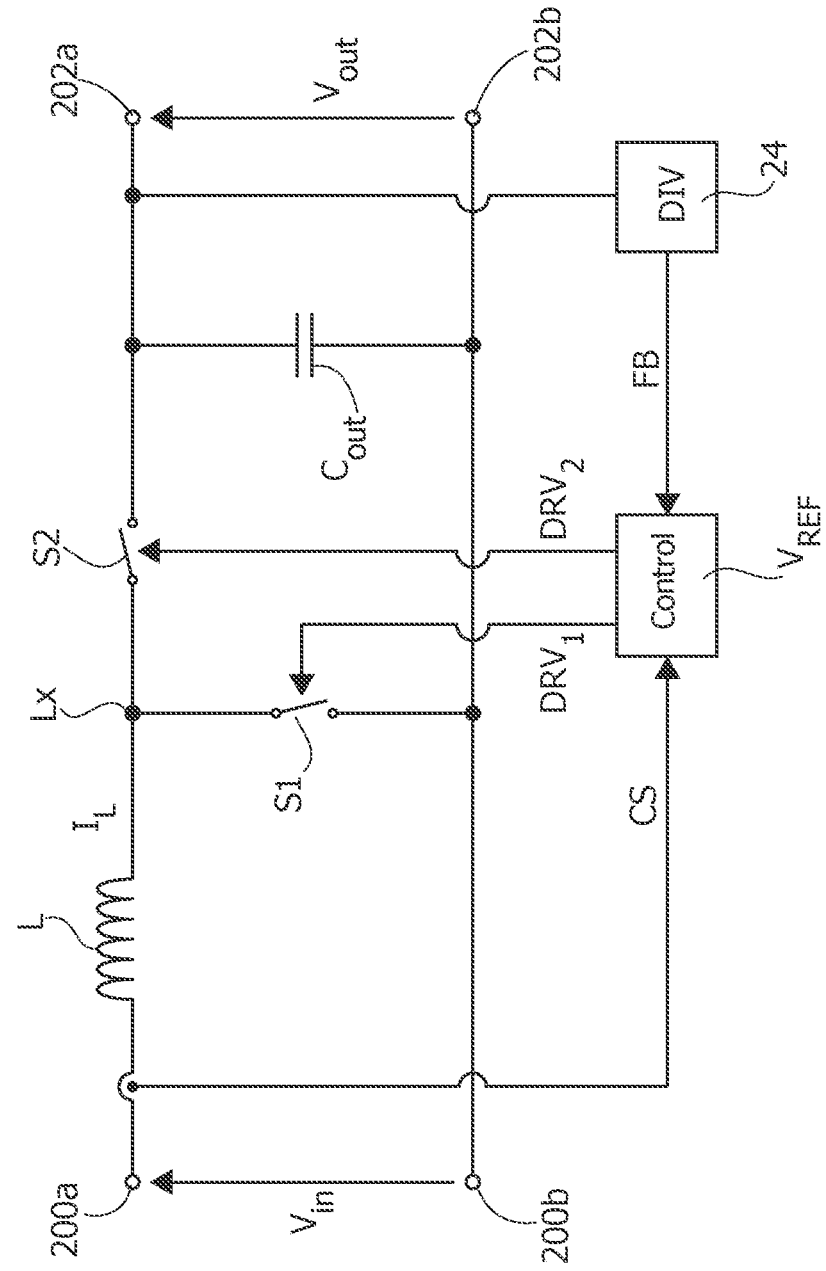
FIG. 5 shows an example of a boost converter.
Figure 6:
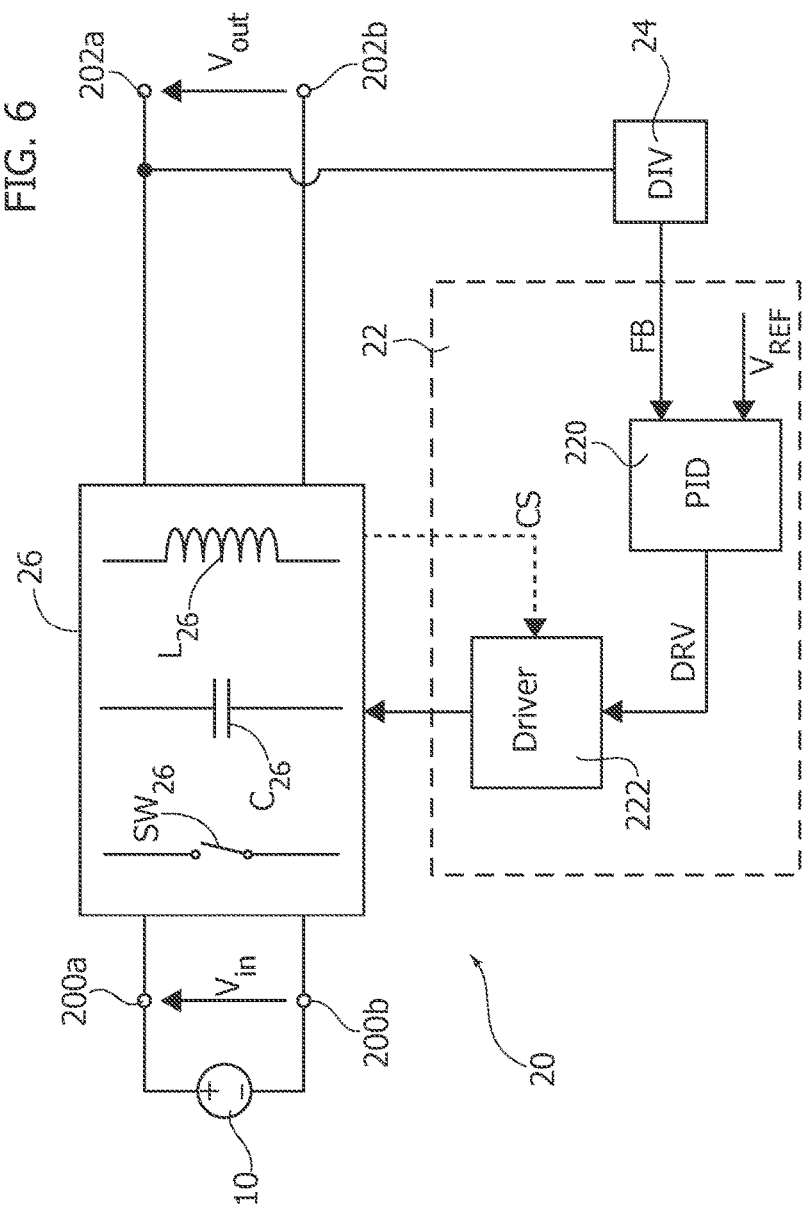
FIG. 6 shows an example of an electronic converter using a PWM signal.
Figure 7:
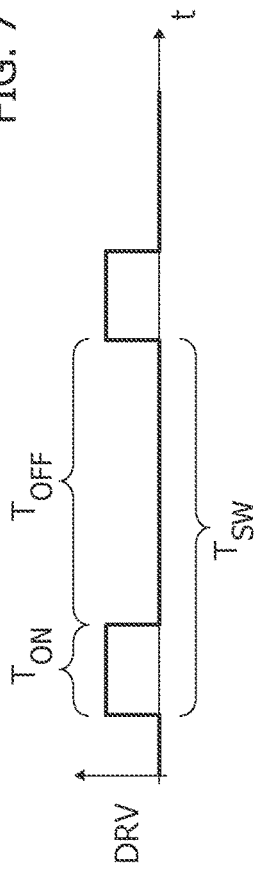
FIG. 7 shows an example of PWM signal of the electronic converter of FIG. 6.
Figure 8:
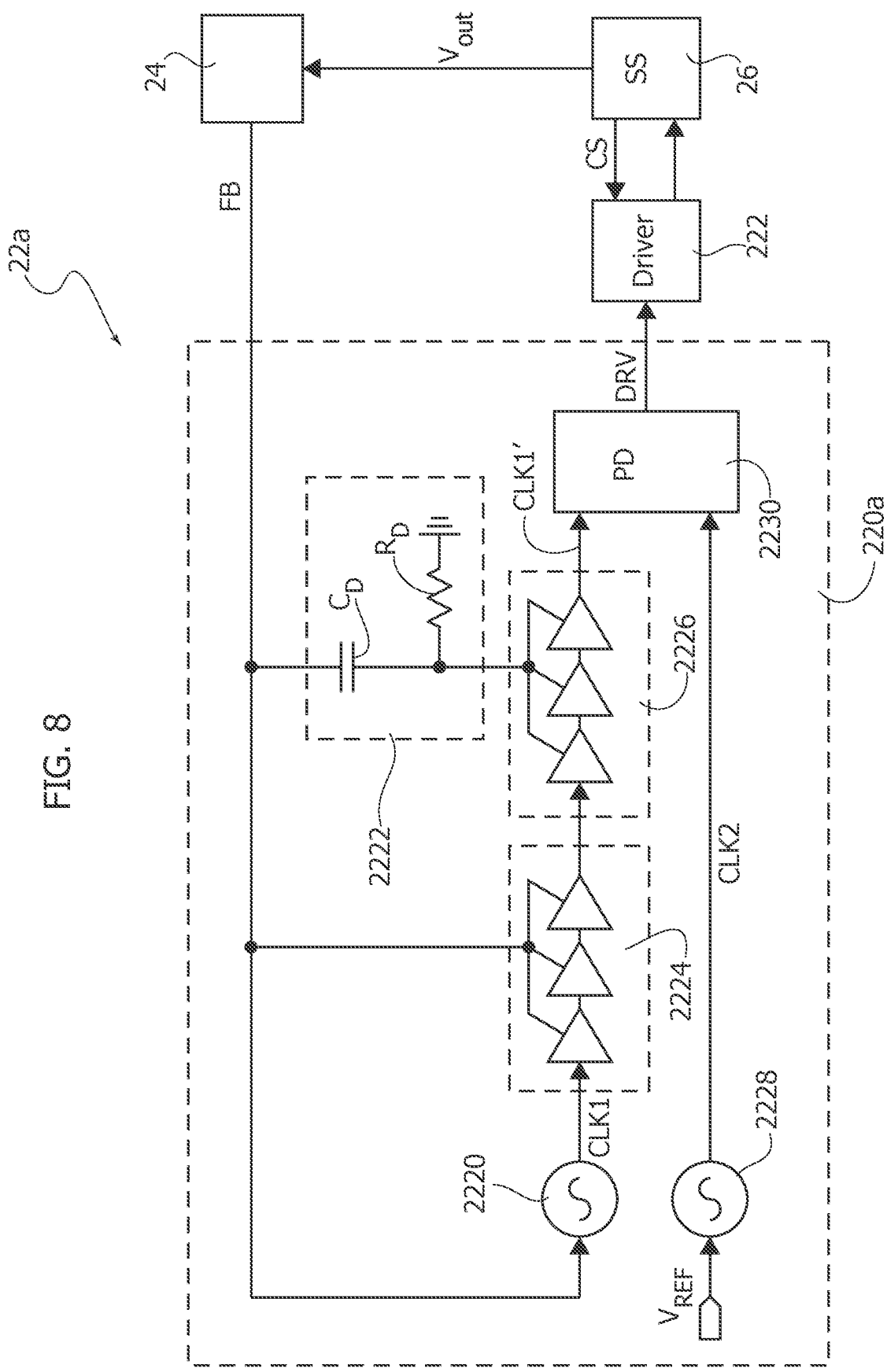
FIG. 8 shows a first example of a time-based control circuit for the electronic converter of FIG. 6.

For example, FIG. 8 schematically shows an example of a time-based control circuit 22a, e.g., in the form of an integrated circuit. Specifically, also in this case, the control circuit 22a comprises: a PWM signal generator 220a configured to generate a PWM signal DRV as a function of a feedback signal FB indicative of the output voltage $V_{out}$ generated by the switching stage (SS) 26 of the electronic converter and a reference voltage $V_{REF}$; and a driver circuit 222 configured to drive a switching stage 26 as a function of the PWM signal DRV.

Specifically, in the embodiment considered, the PWM signal generator 220a comprises: a first voltage-controlled oscillator 2220 configured to generate a first clock signal CLK1 as a function of the feedback signal FB; an analog differentiator 2222 configured to generate a signal indicative of (and preferably proportional to) the derivative of the feedback signal FB, e.g., implemented with a capacitor $C_D$ and a resistor $R_D$ connected in series between the feedback signal FB and a reference voltage, e.g., ground (which may correspond e.g., to the negative input terminal 200b or the negative output terminal 202b), wherein the intermediate node between the capacitor $C_D$ and the resistor $R_D$ corresponds to the signal indicative of the derivative of the feedback signal FB; a first delay line 2224 having a delay as a function of the feedback signal FB and a second delay line 2226 having a delay as a function of the signal indicative of the derivative of the feedback signal FB, wherein the first and second delay lines are connected in cascade and generate a delayed first clock signal CLK1'; a second voltage-controlled oscillator 2228 configured to generate a second clock signal CLK2 as a function of the reference voltage $V_{REF}$; and a phase detector (PD) circuit 2230 configured to generate the PWM signal DRV, wherein the duty cycle of the PWM signal DRV is determined as a function of the phase difference Φ between the clock signal CLK2 and the delayed clock signal CLK1'.

Delay lines having a programmable delay as a function of a voltage or current signal are well known in the art. For example, in this context may be cited U.S. Pat. Nos. 5,650,739 A and 7,696,799 B2 (incorporated by reference).

Figure 9:
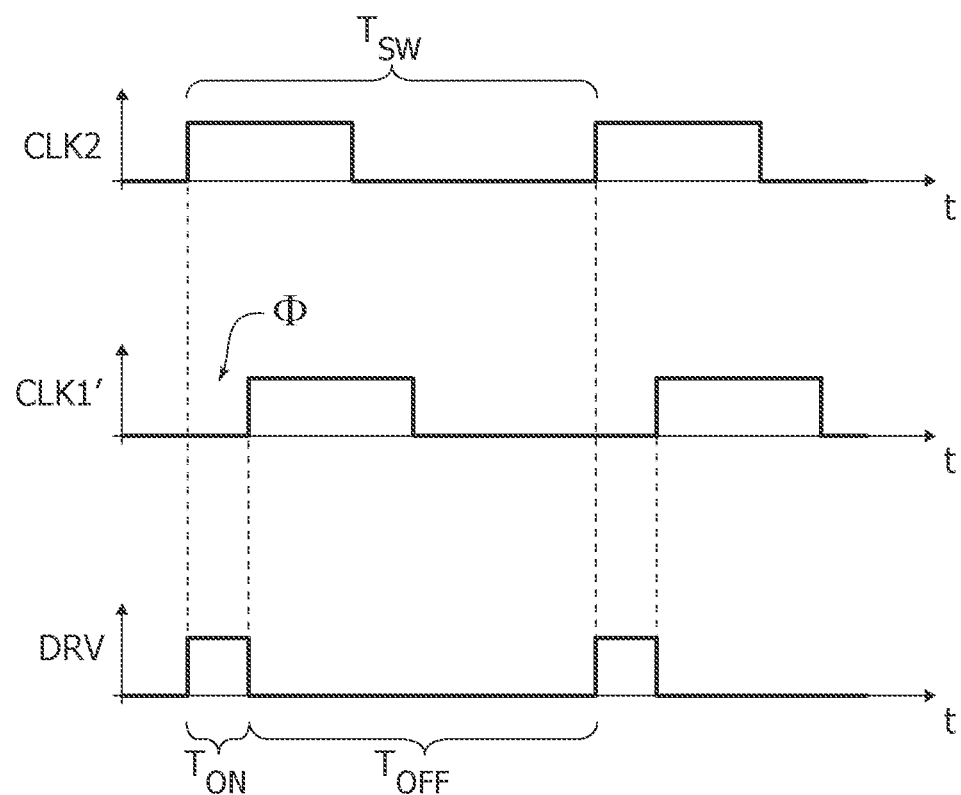
FIG. 9 shows exemplary waveforms of the control circuit of FIG. 8.

For example, as shown in FIG. 9, the phase detector circuit 2230 may be configured to set the signal DRV to high when the second clock signal CLK2 is high and the delayed first clock signal CLK1' is low. For example, the phase detector 2230 may be implemented with one or more logic gates and/or one or more latches.

In the embodiment considered, the second voltage-controlled oscillator 2228 provides thus a clock signal CLK2 having a given (fixed or settable) frequency as a function of the reference voltage $V_{REF}$. Conversely, the first voltage-controlled oscillator 2220 varies the frequency of the first clock signal CLK1 until the feedback signal FB corresponds to the reference voltage $V_{REF}$, and in this steady condition the frequency of the first clock signal CLK1 corresponds to the frequency of the second clock signal CLK2, but the clock signals are phase shifted by a given phase $\Phi_I$. The first oscillator 2220 thus implements a regulator with I (integral) component of the phase $\Phi_I$. Conversely, the first delay line 2224 and the second delay line 2226 introduce an additional phase $\Phi_P$ being proportional to the feedback signal FB and an additional phase $\Phi_D$ being proportional to the derivative of the feedback signal FB, i.e., the total phase shift Φ corresponds to: $\Phi=\Phi_I+\Phi_P+\Phi_D$; wherein, as shown in FIG. 9, the phase shift Φ is proportional to (and preferably corresponds to) the switch on duration $T_{ON}$ (e.g., $T_{ON}=T_{SW}$ (Φ/2π), i.e., the signal DRV is a PWM signal wherein the switch-on duration $T_{ON}$/the duty cycle is varied via a time-based control (with PID regulation) of the phase shift Φ as a function of the feedback signal FB and the reference voltage $V_{REF}$. Accordingly, the phase detector 2230 may also perform other operations, such as a down-scaling operation of the frequency of the clock signals CLK1/CLK2, and it is only relevant that the phase detector 2230 is configured to generate a PWM signal DRV, wherein the switch-on duration $T_{ON}$ of the signal DRV is determined as a function of the phase shift Φ.

Figure 10:
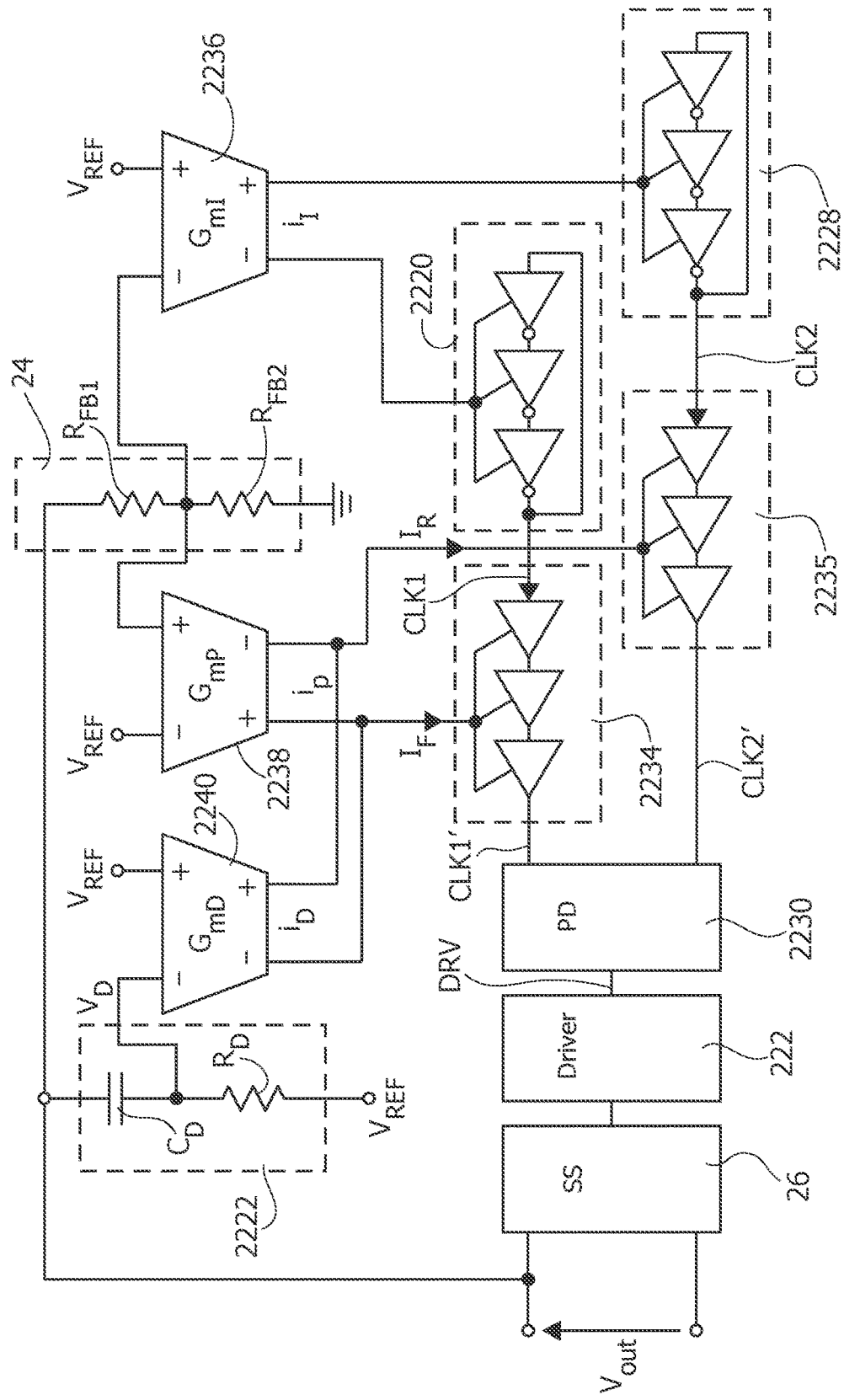
FIG. 10 shows a second example of a time-based control circuit for the electronic converter of FIG. 6.

FIG. 10 shows a second example of a time-based PWM signal generator 220a.

Specifically, in the embodiment considered, the following modifications have been performed, which also may be used separately: the voltage-controlled oscillators 2220 and/or delay lines 2224 and 2226 have been replaced with current-controlled oscillators and/or delay lines; the delay lines 2224 and 2226 have been combined into the same delay line 2234; and a differential approach is used, wherein the oscillators 2220/2228 and/or the delay lines 2234/2235 are driven with differential signal.

Specifically, in the embodiment considered, again a feedback circuit 24 is used to determine a feedback signal FB proportional to the output voltage $V_{out}$. For example, in various embodiments, the feedback circuit 24 is implemented with a voltage divider 24 comprising two or more resistors $R_{FB1}$ and $R_{FB2}$ connected in series between the terminals 202a and 202b, wherein the voltage $V_{FB}$ at one of the resistors, e.g., resistor $R_{FB2}$, corresponds to the feedback signal FB.

In the embodiment considered, the feedback signal FB and the reference voltage $V_{REF}$ are provided to a first differential transconductor 2236, such as a differential operational transconductance amplifier (OTA). For example, in various embodiments, the differential transconductor 2236 provides: a first current $i_{I+}=i_{I0}+i_I/2$; and a second current $i_{I-}=i_{I0}-i_I/2$.

Specifically, in a differential transconductor 2236 the difference $i_I=i_{I+}-i_{I-}$ between the currents and is proportional to the difference between the respective input voltages, i.e., the reference voltage $V_{REF}$ and the feedback voltage $V_{FB}$, i.e., $i_I=G_{MI}(V_{REF}-V_{FB})$.

In the embodiment considered, the current $i_{I+}$ is provided to the current-controlled oscillator 2228 and the current $i_{I-}$ is provided to the current-controlled oscillator 2220, such as two ring-oscillators. Accordingly, the oscillator 2228 generates a clock signal CLK2 having a frequency proportional to the current and the oscillator 2220 generates a clock signal CLK1 having a frequency proportional to the current $i_{I-}$. Thus, when the feedback voltage $V_{FB}$ corresponds to the reference voltage $V_{REF}$, both oscillators are supplied with the current $i_{I0}$, which thus determines the steady state frequency of the clock signals CLK1 and CLK2.

Similarly, the feedback signal FB and the reference voltage $V_{REF}$ are provided to a second differential transconductor 2238, such as a differential operational transconductance amplifier (OTA). For example, in various embodiments, the differential transconductor 2238 provides: a first current $i_{P+}=i_{P0}+i_P/2$; and a second current $i_{P-}=i_{P0}-i_P/2$.

Specifically, in the differential transconductor 2238 the difference $i_P=i_{P+}-i_{P-}$ between the currents $i_{P+}$ and $i_{P-}$ is proportional to the difference between the respective input voltages, i.e., the reference voltage $V_{REF}$ and the feedback voltage $V_{FB}$, i.e., $i_P=G_{MP}(V_{REF}-V_{FB})$.

In the embodiment considered, again an analog differentiator 2222 is used to generate a signal $V_D$ proportional to the derivative of the output voltage $V_{out}$. For example, in the embodiment considered, the analog differentiator 2222 is implemented with a capacitor $C_D$ and a resistor $R_D$ connected between the output voltage $V_{out}$ or the feedback signal FB, and a reference voltage, such as ground or preferably the reference voltage $V_{REF}$. For example, when connecting the resistor $R_D$ to the reference voltage $V_{REF}$ the derivative signal $V_D$ has an offset of $V_{REF}$ to which the derivative component of the output voltage $V_{out}$ is added.

In the embodiment considered, the derivative signal $V_D$, e.g., the voltage at the intermediate node between the capacitor $C_D$ and the resistor $R_D$, and the reference voltage $V_{REF}$ are provided to a third differential transconductor 2240, such as a differential operational transconductance amplifier (OTA). For example, in various embodiments, the differential transconductor 2240 provides: a first current $i_{D+}=i_{D0}+i_D/2$; and a second current $i_{D-}=i_{D0}-i_D/2$.

Specifically, in the differential transconductor 2240 the difference $i_D=i_{D+}-i_{D-}$ between the currents $i_{D+}$ and $i_{D-}$ is proportional to the difference between the respective input voltages, i.e., the reference voltage $V_{REF}$ and the derivative signal $V_D$, i.e., $i_P=G_{MD}(V_{REF}-V_D)$.

Similar to the description of FIG. 8, the currents $i_{P+}$ and $i_{D+}$ and/or the currents $i_{P-}$ and $i_{D-}$, $i_{D-}$ may be provided to respective delay lines, such as: two delay lines connected in series (essentially corresponding to the delay lines 2224 and 2226) may be configured to generate a delayed version CLK1' of the clock signal CLK1 as a function of the currents $i_{P-}$ and $i_{D-}$, respectively; and/or two delay lines connected in series may be configured to generate a delayed version CLK2' of the clock signal CLK2 as a function of the currents $i_{P+}$ and $i_{D+}$.

Generally, the term "and/or" highlights the possibility that these delay lines may be provided for each clock signal (as shown in FIG. 10 for a differential approach) or only for a single clock signal (as shown in FIG. 8).

Conversely, in the embodiment considered, the currents $i_{P+}$ and $i_{D+}$ are provided to a first summation node, which thus provides a current $I_R=i_{P+}+i_{D+}$, and/or the currents $i_{P-}$ and $i_{D-}$ are provided to a second summation node, which thus provides a current $I_F=i_{P-}+i_{D-}$. In the embodiment considered, the current $I_R$ is provided to the delay line 2235 and/or the current $I_F$ is provided to the delay line 2234, such as a sequence of delay stages having a delay as a function of a respective supply current, i.e., the currents $I_F$ and $I_R$.

Figure 11:
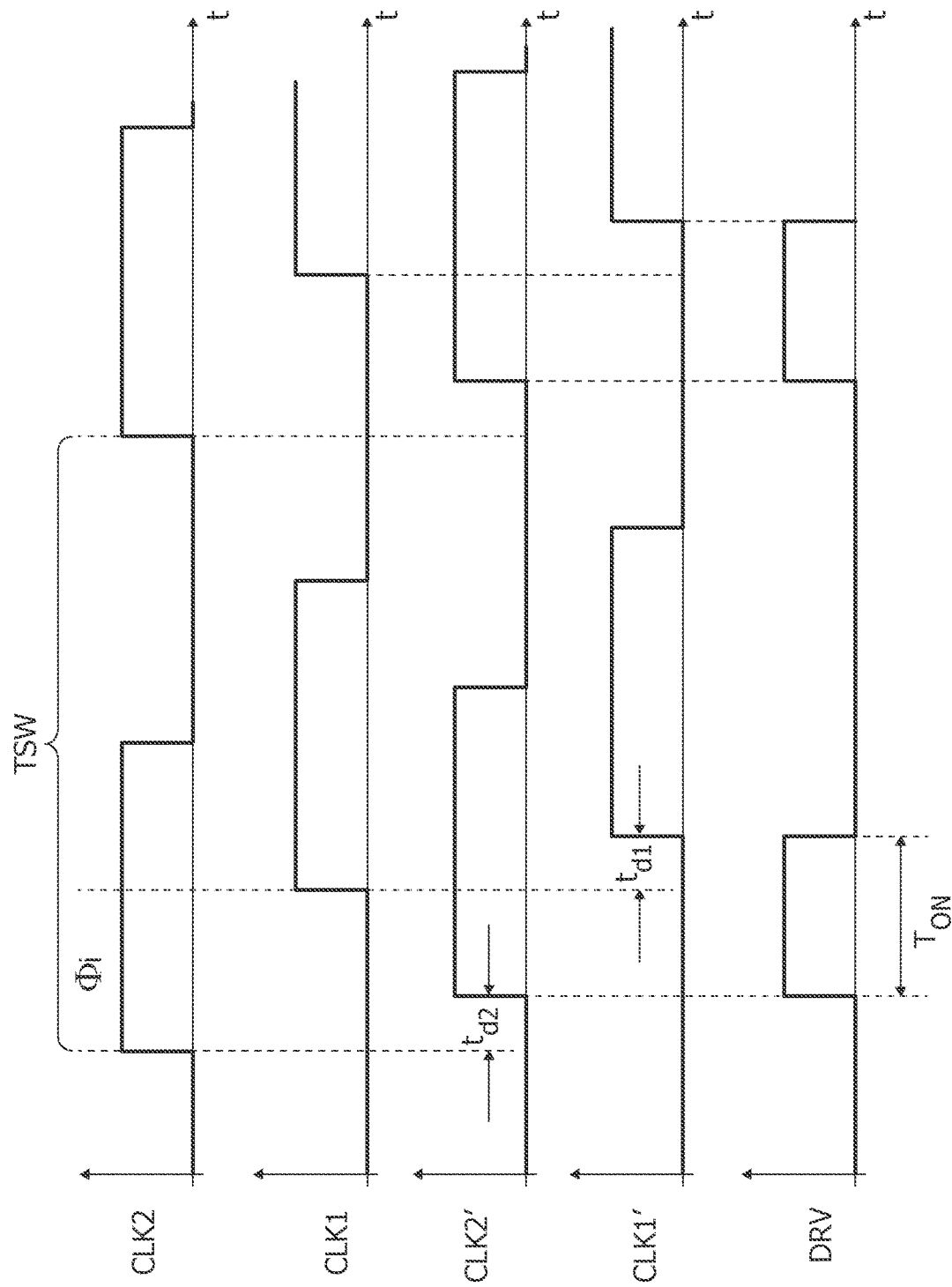
FIG. 11 shows exemplary waveforms of the control circuit of FIG. 10.

Accordingly, in the embodiment considered and as also shown in FIG. 11, the delay stage 2235 generates a delayed clock signal CLK2' having a delay $t_{d2}$ with respect to the clock signal CLK2 and/or the delay stage 2234 generates a delayed clock signal CLK1' having a delay tai with respect to the clock signal CLK1.

In the embodiment considered, the delayed clock signals CLK2' and CLK1' are then provided to a phase detector, which e.g., is configured to: set the signal DRV to a first logic level (e.g., high) at the rising edge of CLK2'; and set the signal DRV to a second logic level (e.g., low) at the rising edge of the signal CLK1'.

Thus, in the embodiment considered, in steady state, the feedback signal $V_{FB}$ corresponds to the reference voltage $V_{REF}$, and by connecting the analog differentiator to the reference voltage $V_{REF}$, also the signal $V_D$ corresponds to the reference voltage $V_{REF}$. Thus, in the steady state, the differential currents $i_D$, $i_P$ and $i_I$ are zero, and (when using a differential approach) the delay $t_{d1}$ of the delay line 2234 corresponds to the delay $t_{d2}$ of the delay line 2235. Moreover, the oscillators 2220 and 2228 provide two clock signals CLK1 and CLK2 having the same frequency and a phase-shift $\Phi_I$. Due to the fact, that the delay lines 2234 and 2235 introduce the same delay $t_{d1}=t_{d2}$ in the embodiment considered, the phase shift $\Phi$ between the delayed clock signals CLK1' and CLK2' corresponds to $\Phi_I$, e.g., the duration $T_{ON}$ corresponds to (or is proportional to) the delay $\Phi_I$, e.g., $T_{ON}=T_{SW}(\Phi_I/2\pi)$. Accordingly, the duty cycle $D=T_{ON}/T_{SW}$ of the signal DRV corresponds thus to $\Phi_I/2\pi$. For example, in a buck converter, the duty cycle may be determined (approximately) as a function of the input and output voltage, i.e., $D=\Phi_I/2\pi=V_{out}/V_{in}$.

As mentioned before, also only one of the delay lines 2234 or 2235 could be used or one of the delay lines could introduce a constant delay, i.e., one of the delays $t_{d1}$ to or $t_{d2}$ could be zero or at least constant. In fact, in this case, the oscillators 2220 and 2228 would generate clock signals having a phase shift $\Phi_I$ which also compensate the constant delay $t_{d1}$ or $t_{d2}$. Thus, in general, in various embodiments, one or more first delay lines 2234 are connected between the oscillator 2220 and the phase detector 2230 and/or one or more second delay lines 2235 are connected between the oscillator 2228 and the phase detector 2230, wherein the one or more first delay lines 2234 and/or the one or more second delay lines 2235 are driven via the currents $i_P$ and $i_D$.

As mentioned before, in various embodiments, the feedback signal FB and the reference voltage $V_{REF}$ are provided to a first differential transconductor 2236, such as a differential operational transconductance amplifier (OTA). For example, in various embodiments, the differential transconductor 2236 provides: a first current $i_{I+}=i_{I0}+i_I/2$; and a second current $i_{I-}=i_{I0}-i_I/2$.

Figure 12:
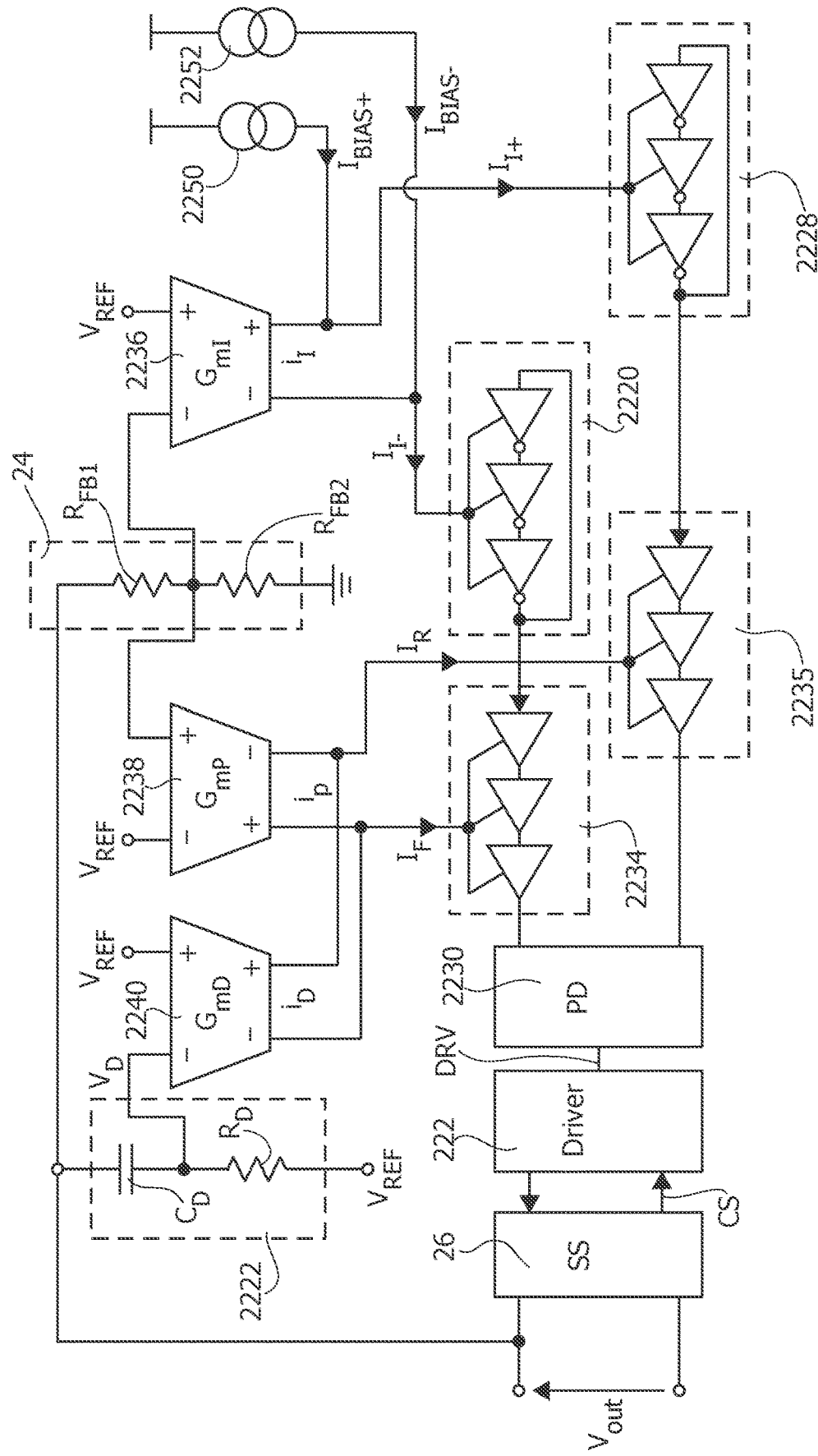
FIG. 12 shows a possible implementation of the time-based control circuit of FIG. 10.

FIG. 12 shows in this respect an embodiment for implementing the above biasing of the current $i_{I0}$.

Specifically, in the embodiment considered, the differential transconductor 2236 just provides the differential component $i_I$, i.e.: a first (positive) terminal of the differential transconductor 2236 provides a first current $i_I/2$, wherein the first terminal is connected to the current controlled oscillator 2228; and a second (negative) terminal of the differential transconductor 2236 provides a first current $-i_I/2$, wherein the first terminal is connected to the current controlled oscillator 2220.

In the embodiment considered, a first current source 2250 providing a current $I_{BIAS+}=i_{I0}$ is thus connected to the first terminal of the differential transconductor 2236, whereby the current controlled oscillator 2228 receives a current $i_{I+}=i_{I0}+i_I/2$. Similarly, a second current source 2252 providing a current $I_{BIAS-}=i_{I0}$ is connected to the second terminal of the differential transconductor 2236, whereby the current controlled oscillator 2220 receives a current $i_{I-}=i_{I0}-i_I/2$.

Generally, the differential transconductor 2236 may also provide a common mode current, which thus would also be added to the currents provided to the current controlled oscillators 2220 and 2228. However, without loss of generality, this common mode current is usually small and will be neglected in the following. Accordingly, neglecting the common mode current provided by the differential transconductor 2236, the current controlled oscillators 2220 and 2228 are equally biased with a common-mode current $I_{BIAS+}=I_{BIAS-}$, so that in steady state (i.e., when the loop is closed, FB=$V_{REF}$) the differential current $i_I$ provided by the differential transconductor 2236 is zero, i.e., the current controlled oscillators 2220 and 2228 oscillate with the same frequency $F_{SW}$. Accordingly, the frequency $F_{SW}$ is nominally constant across the entire input and output voltage range and only determined by the bias currents $I_{BIAS+}$ and $I_{BIAS-}$ (and the actual common mode current of the differential transconductor 2236). This applies also in case of the single ended configuration, when the differential amplifier 2236 just provides a current $I_I$ to one of the current controlled oscillators 2220 or 2228.

Conversely, focusing on the delay-lines 2234 and 2235, in steady-state the (differential) currents $i_D$ and $i_P$ provided by the (differential) transconductors 2238 and 2240 are zero. Supposing the delay lines are matched, they both introduce the same delay $t_{d1}=t_{d2}$ and therefore the same phase-shift.

In this respect, in steady state, the regulator circuit should generate a PWM signal DRV, which ensures that the electronic converter generates the requested output voltage $V_{out}$. As mentioned before, in this case, the two oscillators 2220 and 2228 provide two clock signals CLK1 and CLK2 with the same frequency $F_{SW}$ and the phase-shift $\Phi$ is related to the converter duty-cycle $D_{PWM}$, e.g., in case of a buck and without considering efficiency:

$$D_{PWM}=T_{ON}/(T_{ON}+T_{OFF}))=\Phi/2\pi=V_{out}/V_{in}$$

Again, it is important to note that the phase-shift $\Phi$ is dictated by the integral $\Phi_I$ action only, while the proportional $\Phi_P$ and derivative $\Phi_P$ actions have effects just during transients.

However, it will be noted that, in the steady state condition, the output voltage $V_{out}$ may be subject to an offset.

On the one hand, as mentioned before, typically a resistive voltage divider $R_{FB1}$ and $R_{FB2}$ is used to generate the feedback signal FB, which is provided to the transconductor 2236 (and similarly the transconductor 2238). Such a voltage divider may thus introduce an offset due to an unexpected divider ratio. However, thanks to the integral action, the regulator circuit varies the currents $I_{I-}$ and $I_{I+}$ until the feedback signal FB corresponds to the reference voltage $V_{REF}$. Accordingly, a mismatch between the resistors $R_{FB1}$ and $R_{FB2}$, translates into an offset error of the regulated output voltage $V_{out}$. Similar issues may also exist with other feedback circuits 24, such as level-shifters. Such a feedback mismatch is well-known in the context of PID regulators, and is not limited to time-based controllers. Although integrated resistors may be matched very well, trimming actions on the feedback divider 24 or other calibration methods may be exploited to minimize the residual output voltage offset.

On the other hand, in time-based controllers, another major source of an offset of the output voltage $V_{out}$ are possible unequal common-mode currents of the current-controlled oscillators 2220 and 2228. For example, when the bias currents $I_{BIAS+}$ and $I_{BIAS-}$ are not equal, the control loop has to take care of such an unbalanced bias of the current-controlled oscillators 2220 and 2228. Substantially, in this case, the control loop has to provide, even in the steady state, a current $I_I$ being different from zero, thereby imposing again currents $I_{I+}=I_{I-}$ on the current-controlled oscillators, whereby an undesired offset is introduced in the output voltage $V_{out}$.

Similar issues do not apply to the delay lines (for the proportional and derivative regulation), because even though the delays $t_{d1}$ and $t_{d2}$ may not be equal (e.g., due to an unequal common mode current), such an effect is compensated by the integral regulation and therefore does not contribute to the output offset.

In this respect, the offset introduced via such unmatched bias currents may also be rather significant. Accordingly, in order to reduce such a voltage offset, the bias current sources 2250 and 2252 should be matched.

For example, in various embodiments, the current sources 2250 and 2252 may be implemented via two output stages of the same current mirror, wherein the two output transistors of the current mirror are matched transistors. However, also in this case, the currents $I_{BIAS+}$ and $I_{BIAS-}$ may not be perfectly matched and, e.g., a trimming or calibration operation of the currents $I_{BIAS+}$ and $I_{BIAS-}$ may be required.

However, unfortunately, the nominal operating frequency $F_{SW}$ of such a time-based regulator circuit should often be settable, e.g., programmable, which thus implies that also the current sources 2250 and 2252 should provide settable currents $I_{BIAS+}$ and $I_{BIAS-}$. For example, in various embodiments, the current generators 2250 and 2252 may be variable current generators, wherein the values of the currents $I_{BIAS+}$ and $I_{BIAS-}$ are settable/programmable, e.g., as a function of a digital or analog control signal. For example, in the context of a current mirror with two output transistors, the current fed to the input stage of the current mirror may be settable.

Such a programming may be required, e.g., due to changing operating conditions, and may often be performed also dynamically (i.e., on-the-fly, in real-time). This translates into an output regulation offset that usually changes with the operating frequency $F_{SW}$.

Moreover, the current offset between the current sources 2250 and 2252 is usually process-voltage-temperature (PVT) dependent. Accordingly, a robust solution is required in order to avoid this uncontrolled output offset over various operating conditions of the regulator circuit 220a.

In this respect, simply performing a trimming action to compensate such offset may thus be practically impossible, especially in case of multiple applicative scenarios as discussed above. Moreover, trimming solutions are, by definition, time consuming and add extra cost for the final test. Finally, a trimming solution usually is not robust and reliable, because it is an open-loop solution that does not take into account temperature variations, aging and all the other possible phenomena that may occur after the final testing (e.g., packaging and assembly, soldering, etc.). In addition, the discrete and finite nature of a trimming action usually does not permit to reach a zero residual error.

Figure 13:
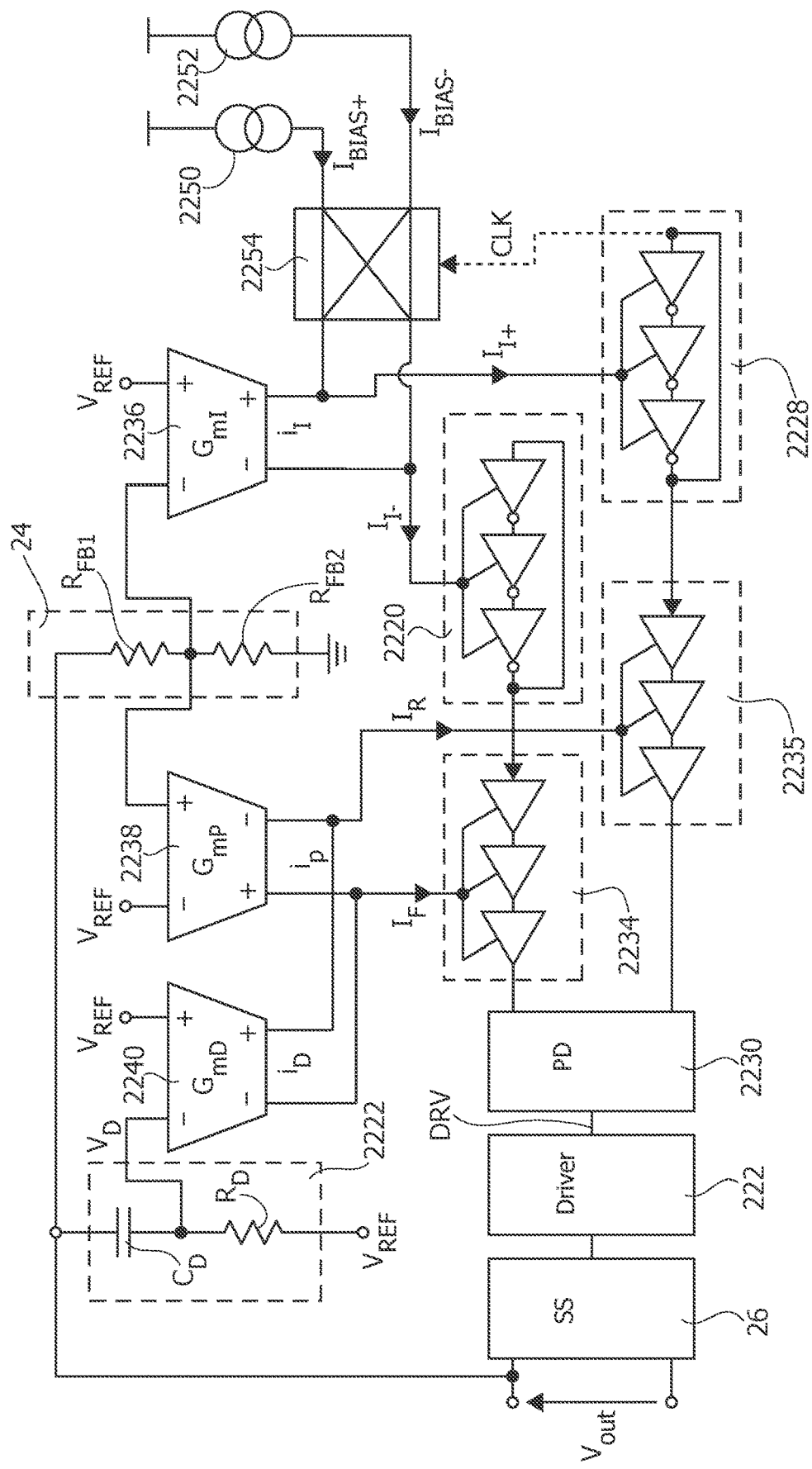
FIG. 13 shows an embodiment of a modified time-based control circuit.

FIG. 13 shows an embodiment of a different solution.

As mentioned before, a mismatch between the current $I_{BIAS+}$ and $I_{BIAS-}$ usually cannot be avoided, in particular over all operation condition.

In the embodiment considered, the regulator circuit 220a is configured to perform an averaging operation of the bias currents provided to the current controlled oscillators 2220 and 2228. Specifically, for this purpose is used a time-based averaging operation, wherein over a given time period the current $I_{BIAS+}$ is provided for 50% to the current-controlled oscillator 2220 and for 50% to the current-controlled oscillator 2228. Similarly, the current $I_{BIAS-}$ is provided for 50% to the current-controlled oscillator 2228 and for 50% to the current-controlled oscillator 2220.

For example, this is schematically shown in FIG. 13, wherein the current generators 2250 and 2252 are connected via a switching circuit 2254, such as a butterfly switching circuit, to the output terminals of the differential transconductor 2236, i.e., the input terminals of the current-controlled oscillators 2220 and 2228.

Figure 14:
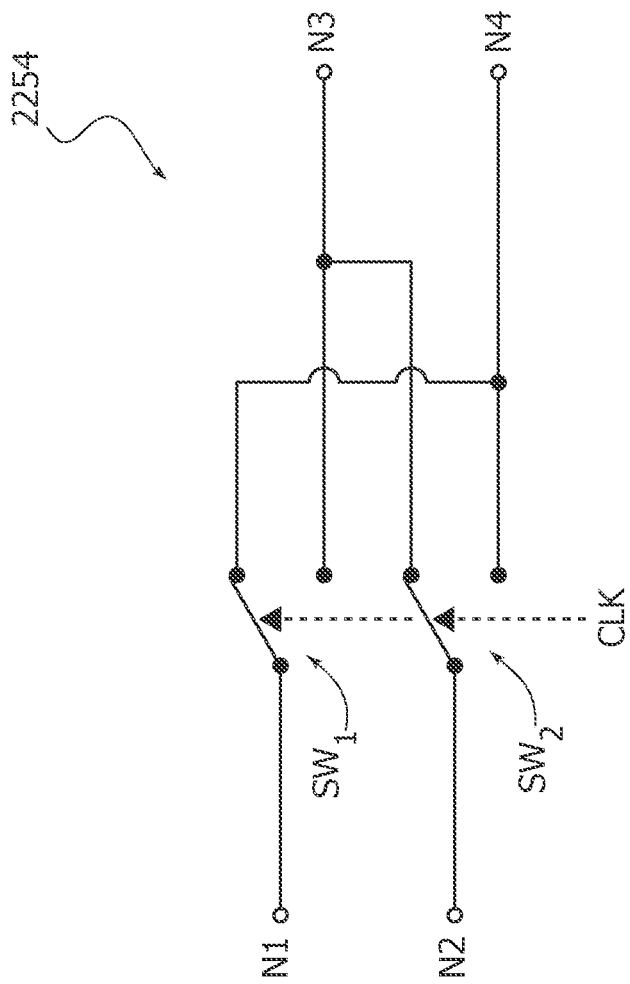
FIG. 14 shows an embodiment of a switching circuit used in the time-based control circuit of FIG. 13.

Accordingly, as schematically shown in FIG. 14, such a switching circuit 2254 comprises four terminals, wherein: a terminal N1 is connected to the positive output terminal of the transconductor 2236/the current-controlled oscillator 2228; a terminal N2 is connected to the negative output terminal of the transconductor 2236/the current-controlled oscillator 2220; a terminal N3 is connected to the current generator 2250; and a terminal N4 is connected to the current generator 2252.

Moreover, the switching circuit 2254 is configured to: in a first switching condition, connect the terminal N1 to the terminal N4, i.e., the current generator 2252 to the oscillator 2228, and the terminal N2 to the terminal N3, i.e., the current generator 2250 to the oscillator 2220; and in a second switching condition, connect the terminal N1 to the terminal N3, i.e., the current generator 2250 to the oscillator 2228, and the terminal N2 to the terminal N4, i.e., the current generator 2252 to the oscillator 2220.

For example, as schematically shown in FIG. 14, the switching circuit 2254 may comprise for this purpose two deviator switches SW1 and SW2. For example, a deviator switch be implemented with two electronic switches, such as FET.

As mentioned before, the switching between these two switching conditions should be performed based on the logic level of a PWM signal having a 50% duty cycle, such as a clock signal CLK.

In an embodiment of the implementation, averaging may be performed with a frequency, which remains outside of the bandwidth of the control loop, i.e., so that the averaging process should not influence the control-loop. It will be noted that the clock signal CLK should not be too high, in order to allow the currents provided to the oscillators 2220 and 2228 to correctly settle within half of the clocking period (at least).

In an example embodiment, the clock signal CLK may correspond to one of the clock signals already used within the regulator circuit 220a, such as the clock signal CLK1 or the clock signal CLK2 generated by the oscillators 2220 and 2228, respectively. In this respect, the selection of the clock signal CLK1 or the clock signal CLK2 is rather irrelevant, because in steady state, both clock signals should have the same frequency. Generally, the clock signal CLK may also correspond to a down-scaled version of the clock signal CLK1 or CLK2, i.e., the clock signal CLK may be generated via a frequency divider receiving at input the clock signal CLK1 or CLK2, whereby the period of the clock signal CLK is a multiple of the period of the clock signal CLK1 or CLK2.

On the one hand, this avoids the need of an additional clock generator. On the other hand, this ensures that the averaging action is automatically performed according to the converter switching frequency $F_{SW}$, which is usually also higher than the loop bandwidth. In this way, if the DC-DC converter supports different switching frequencies $F_{SW}$ (i.e., different common-mode bias currents $I_{BIAS+}$ and $I_{BIAS-}$ feeding the oscillators 2220 and 2228), there is no need to recalibrate/retune the averaging action, because it remains automatically aligned with the DC-DC switching frequency $F_{SW}$.

Accordingly, the proposed solutions allow to avoid mismatches and non-idealities of the common-mode current generators 2250 and 2252, thus ensuring in steady state average values of the current $I_{I-}$ and $I_{I+}$, which correspond, i.e., $AVG(I_{I-})=AVG(I_{I+})$. As a consequence, the negative feedback loop does not need to provide any balancing action and therefore the (differential) current $I_I$ provided by the transconductor 2236 remains zero in steady state (i.e., $I_I=0$). This also implies that no offset is produced in the output voltage $V_{out}$ due to this mismatch.

In various embodiments, the proposed solution is auto consistent and automatically performs the averaging action ensuring that, steadily, the output offset is zeroed. Being the solution based on an averaging operation, the output offset is cancelled irrespective of any PVT variation, aging, components derating or any other phenomena that may happen after the final test and packaging/assembly. Accordingly, the solution is robust with respect to the operating conditions, in particular the switching frequency $F_{SW}$, the input and output voltages $V_{in}$ and $V_{out}$, and the values of the inductance(s) $L_{26}$ and capacitance(s) $C_{26}$ of the switching stage 26, and loop compensation choices, in particular the gain $G_{mI}$ of the transconductor 2236.

It will be noted that the proposed solution has practically a zero impact on the quiescent current consumption (nor efficiency and neither power consumption). In fact, in various embodiments, the solution requires only the actuation of a butterfly switch 2254, without the need of any other complex analog or digital circuits. Moreover, in various embodiments, also no separated clock signal CLK has to be generated. Accordingly, in terms of system complexity and area, basically there are no substantial difference with respect to an implementation without the proposed solution.

It will also be noted that the proposed solution not only improves the static performances of the converter, but also the dynamic performances. In fact, without a matching of the bias currents, the transconductor 2236 would remain unbalanced in steady state. Accordingly, the transconductor 2236 would be forced to operate in a bias condition that inherently exacerbates its non-linearity and emphasizes its non-idealities. Non-linearities within the loop negatively affect the whole DC-DC transient response and should be always minimized. Conversely, with the proposed averaging solution, the unbalancing of the transconductor 2236 due to different common-mode bias currents $I_{BIAS+}$ and $I_{BIAS-}$ for the oscillators 2220 and 2228 is mitigated, and therefore the system linearity is improved, as well as the converter transient response.

Finally, as mentioned before, the current generators 2250 and 2252 may be implemented as two output stages of the same current mirror. In this respect, the proposes solutions permit that this current mirror may have a less complex design, because also bigger mismatches between the output stages of the current mirror are compensated by the disclosed averaging operation.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the previous embodiments have been described with respect to a PID regulator, the embodiments mainly relate to the implementation of the I component with the transconductor 2236 and the current-controlled oscillators 2220 and 2228. Accordingly, the D and/or P components are purely optional. For example, this implies that one or even both of the transconductor 2238 and 2240 may be omitted.

Moreover, the solutions may also be applied to the PID regulator shown in FIG. 8 by simply replacing the oscillators 2220 and 2228 with current controlled oscillators. For example, this implies that also voltage-controlled delay lines may be used. Moreover, instead of using differential amplifiers, also a single ended configuration may be used for one or more of the components P, I and D.

The claims form an integral part of the technical teaching of the description provided herein.

The invention claimed is:
1. A control circuit for a switching stage of an electronic converter configured to provide an output voltage, the control circuit comprising:
  a first terminal configured to provide a drive signal to a corresponding electronic switch of said switching stage;
  a second terminal configured to receive a first feedback signal proportional to said output voltage from a feedback circuit;
  a driver circuit configured to generate said drive signal as a function of a Pulse-Width Modulation (PWM) signal; and
  a PWM signal generator circuit configured to generate said PWM signal as a function of said first feedback signal and a reference voltage, wherein said PWM signal generator circuit comprises:

a first current-controlled oscillator having an input terminal configured to receive a first current and generate a first clock signal as a function of said first current;

a second current-controlled oscillator having an input terminal configured to receive a second current and generate a second clock signal as a function of said second current;

a first operational transconductance amplifier configured to provide at a first amplifier output a third current indicative of a difference between said reference voltage and said first feedback signal, wherein said first amplifier output of said first operational transconductance amplifier is connected to said input terminal of said first current-controlled oscillator; and a phase detector having inputs coupled to said first oscillator and said second oscillator and providing at an output said PWM signal;

wherein said PWM signal generator circuit further comprises:
  a first bias current generator configured to provide a first bias current at a first bias output;
  a second bias current generator configured to provide a second bias current at a second bias output; and
  a switching circuit configured to receive a switch clock signal and:
    when a logic level of said switch clock signal has a first logic level, connect the first bias output of said first bias current generator to the input terminal of said first current-controlled oscillator and connect the second bias output of said second bias current generator to the input terminal of said second current-controlled oscillator, and
    when the logic level of said switch clock signal has a second logic level, connect the first bias output of said first bias current generator to the input terminal of said second current-controlled oscillator and connect the second bias output of said second bias current generator to the input terminal of said first current-controlled oscillator.

2. The control circuit according to claim 1, wherein said switch clock signal is derived from said first clock signal or said second clock signal.

3. The control circuit according to claim 2, wherein said switch clock signal corresponds to one of said first clock signal or said second clock signal.

4. The control circuit according to claim 1, wherein said PWM signal generator circuit further comprises:
  a first delay line connected between said first current-controlled oscillator and said phase detector, and
  a second delay line connected between said second current-controlled oscillator and said phase detector.

5. The control circuit according to claim 4, wherein one or more of said first delay line and second delay line is driven as a function of the difference between said reference voltage and said first feedback signal.

6. The control circuit according to claim 4, comprising a terminal configured to receive from an analog differentiator a second feedback signal proportional to a derivative of said output voltage, and wherein one or more of said first delay line and second delay line is driven as a function of the difference between said reference voltage and said second feedback signal.

7. The control circuit according to claim 6, comprising at least one of:

said one or more electronic switches of said switching stage;
said feedback circuit; and
said analog differentiator.

8. The control circuit according to claim 6, wherein each of said first delay line and said second delay line is a current-controlled delay line, and wherein said PWM signal generator circuit further comprises:
  a second operational transconductance amplifier configured to generate a fourth current indicative of a difference between said reference voltage and said first feedback signal;
  a third operational transconductance amplifier configured to generate a fifth current indicative of a difference between said reference voltage and said second feedback signal;
  wherein said fourth current and said fifth current are provided to one or more of the first delay line and the second delay line.

9. The control circuit according to claim 1, wherein said first operational transconductance amplifier is a differential operational transconductance amplifier configured to provide at a second amplifier output a sixth current, wherein a difference between said sixth current and said third current is proportional to a difference between a reference voltage and said first feedback signal, and wherein said second amplifier output of said first operational transconductance amplifier is connected to said input terminal of said second current-controlled oscillator.

10. The control circuit according to claim 1, wherein said electronic converter is a buck or boost converter.

11. The control circuit according to claim 1, where a frequency of the switch clock signal is outside a bandwidth of a control loop for the control circuit.

12. An integrated circuit comprising a control circuit according to claim 1.

13. An electronic converter, comprising:
  a switching stage, and
  a control circuit according to claim 1.

14. A control circuit for a switching stage of an electronic converter configured to generate an output voltage, comprising:
  a feedback circuit configured to generate a feedback signal from said output voltage;
  an operational transconductance amplifier configured to generate, in response to a difference between a reference voltage and said feedback signal, a first output current and a second output current;
  a first current-controlled oscillator having an input coupled to receive the first output current and configured to generate a first clock signal;
  a second current-controlled oscillator having an input coupled to receive the second output current and configured to generate a second clock signal;
  a phase detector circuit configured to generate a drive signal for the switching stage of the electronic converter in response to a phase difference between the first and second clock signals;
  a first bias current generator configured to generate a first bias current;
  a second bias current generator configured to generate a second bias current; and
  a switching circuit controlled by a switch clock signal to:
    when the switch clock signal has a first logic level, apply the first bias current to the input of said first current-controlled oscillator and apply the second bias current to the input of the said second current-controlled oscillator, and when the switch clock signal has a second logic level, apply the second bias current to the input of said first current-controlled oscillator and apply the first bias current to the input of the said second current-controlled oscillator.

15. The control circuit according to claim 14, wherein a frequency of the switch clock signal is outside a bandwidth of a control loop for the control circuit.

16. The control circuit according to claim 14, wherein said switch clock signal is derived from said first clock signal.

17. The control circuit according to claim 14, wherein said switch clock signal is derived from said second clock signal.

18. The control circuit according to claim 14, wherein said switch clock signal corresponds to said first clock signal.

19. The control circuit according to claim 14, wherein said switch clock signal corresponds to said second clock signal.

20. The control circuit according to claim 14, wherein said electronic converter is a buck or boost converter.

\* \* \* \* \*